United States Patent
Ishibashi et al.

(10) Patent No.: US 7,779,783 B2
(45) Date of Patent: Aug. 24, 2010

(54) PLASMA PROCESSING DEVICE

(75) Inventors: Kiyotaka Ishibashi, Hyogo (JP); Toshihisa Nozawa, Hyogo (JP)

(73) Assignee: Tokyo Electron Limited, Tokyo (JP)

( * ) Notice: Subject to any disclaimer, the term of this patent is extended or adjusted under 35 U.S.C. 154(b) by 303 days.

(21) Appl. No.: 10/524,038

(22) PCT Filed: Aug. 12, 2003

(86) PCT No.: PCT/JP03/10274

§ 371 (c)(1),
(2), (4) Date: Feb. 9, 2005

(87) PCT Pub. No.: WO2004/017684

PCT Pub. Date: Feb. 26, 2004

(65) Prior Publication Data

US 2006/0005769 A1   Jan. 12, 2006

(30) Foreign Application Priority Data

Aug. 14, 2002  (JP) .............................. 2002-236314

(51) Int. Cl.
- C23C 16/00 (2006.01)
- C23F 1/00 (2006.01)
- H01L 21/306 (2006.01)
- H05B 6/10 (2006.01)
- B23K 9/00 (2006.01)

(52) U.S. Cl. ............... 118/723 MW; 118/723 ME; 118/723 MR; 118/723 MA; 156/345.36; 156/345.41; 156/345.42; 156/345.46; 156/345.52; 219/121.43; 219/678

(58) Field of Classification Search ......... 118/723 MW, 118/723 I; 156/345.36, 345.41, 345.42, 345.48
See application file for complete search history.

(56) References Cited

U.S. PATENT DOCUMENTS

| 5,234,526 A | * | 8/1993 | Chen et al. ............. 156/345.42 |
| 5,466,991 A | * | 11/1995 | Berry .................... 315/111.41 |
| 6,091,045 A | * | 7/2000 | Mabuchi et al. ........ 219/121.43 |
| 2001/0025607 A1 | * | 10/2001 | Lebar et al. ......... 118/723 MW |
| 2002/0011215 A1 | * | 1/2002 | Tei et al. ............. 118/723 MW |
| 2002/0020498 A1 | * | 2/2002 | Ohmi et al. .................. 156/345 |

(Continued)

FOREIGN PATENT DOCUMENTS

JP          63-126196          5/1988

(Continued)

*Primary Examiner*—Parviz Hassanzadeh
*Assistant Examiner*—Rakesh Dhingra
(74) *Attorney, Agent, or Firm*—Oblon, Spivak, McClelland, Maier & Neustadt, L.L.P.

(57) ABSTRACT

A plasma processing apparatus includes a chamber, a dielectric top plate member disposed on an upper portion of the chamber and an antenna having a plurality of slots. The antenna is disposed on the top plate member and is in close contact with the top plate member. The top plate member includes a flat plate portion formed to face the substrate and a sidewall portion formed to extend from a peripheral region of the flat plate portion towards the substrate. The sides of the flat plate portion and the sidewall portion facing a plasma generation region have a curved surface extending between the flat plate portion and the sidewall portion and the sidewall portion has a thickness not smaller than $\lambda_g/4$ but not greater than $\lambda_g$, $\lambda_g$ being a wavelength of the microwave.

12 Claims, 7 Drawing Sheets

U.S. PATENT DOCUMENTS

2002/0038692 A1* 4/2002 Ishii et al. .............. 156/345.48

FOREIGN PATENT DOCUMENTS

| | | |
|---|---|---|
| JP | 8-106994 | 4/1996 |
| JP | 9-181046 | 7/1997 |
| JP | 10-294199 | 11/1998 |
| JP | 11-260594 * | 9/1999 |
| JP | 2000-331998 | 11/2000 |
| JP | 2001-167900 | 6/2001 |
| JP | 2002-299240 | 10/2002 |
| JP | 2003-289065 | 10/2003 |

* cited by examiner

PLASMA PROCESSING DEVICE

FIELD OF THE INVENTION

The present invention relates to a plasma processing apparatus; and more particularly, to a plasma processing apparatus for performing a predetermined process on a substrate by a plasma generation region formed by introducing a microwave into a chamber.

BACKGROUND OF THE INVENTION

With a recent trend toward a high density and miniaturation of semiconductor devices, plasma processing apparatus have been used to perform such processes as film forming, etching, ashing, and the like in a fabrication process of the semiconductor devices. Specifically, in a microwave plasma processing apparatus for producing a plasma using a microwave, the plasma can be produced stably under a relatively low pressure (high vacuum) condition of about 0.1~10 Pa. Thus, the microwave plasma processing apparatus using, e.g., a microwave having a frequency of 2.45 GHz has attracted considerable attention.

An example of such a conventional plasma processing apparatus will now be explained. As shown in FIG. 6, the plasma processing apparatus includes a chamber 101 accommodating therein a substrate 111 and performing a predetermined process thereon; a high frequency power supply 105 for generating a microwave; and an antenna unit 103 for irradiating the microwave into the chamber 101.

The antenna unit 103 is formed of a slot plate 103c, a wave retardation plate 103b, and an antenna cover 103a. In the slot plate 103c, there are provided a plurality of slots (openings) for irradiating the microwave towards the inside of the chamber 101. The microwave generated from the high frequency power supply 105 is provided to the antenna unit 103 by a waveguide 106.

A top plate 104 serving as a part of a partition wall of the chamber 101 is disposed in an upper part of the chamber 101. The top plate 104 is made of a dielectric material, e.g., a quartz. A sealing member 114, e.g., an O-ring or the like, is provided between the top plate 104 and the partition wall of the chamber 101. The antenna unit 103 is disposed above the top plate 104.

In the chamber 101, a susceptor 107 for supporting the substrate 111 accommodated therein is provided. Further, a vacuum pump 109 is connected to the chamber 101 in order to vacuum-exhaust the inside thereof.

In the above-described plasma apparatus, the inside of the chamber 101 is exhausted to vacuum by the vacuum pump 109, and e.g., an argon gas is introduced into the chamber 101 as a gas for producing a plasma under a predetermined pressure range.

As shown in FIG. 7, the microwave generated by the high frequency power supply 105 arrives at the antenna unit 103 via the waveguide 106. The microwave arriving at the antenna unit 103 propagates through the wave retardation plate 103b, as indicated by arrows, and is irradiated into the chamber 101 via the slot plate 103c to thereby generate an electromagnetic field therein.

The argon gas is dissociated by the electromagnetic field generated in the chamber 101 to thereby forming a plasma generation region 122 between the substrate 111 and the top plate 104, and thus a predetermined plasma processing is performed on the substrate 111.

In the plasma generation region 122 formed in the chamber 101, electrons and ions (charged particles) present in the plasma generation region 122 oscillate with predetermined plasma frequencies to maintain the plasma generation region 122 in an electrically neutral state. The plasma frequency tends to increase as a charge density is high and a mass of the charged particle is small.

Therefore, in the plasma generation region 122, the plasma frequency of the electron having a mass substantially smaller than that of the ion is considerably high compared to that of the ion, and it is in a microwave region. At this time, if the frequency of the microwave generated by the high frequency power supply 105 is higher than the plasma frequency, the microwave can propagate through the plasma generation region 122 and be supplied into the plasma generation region 122.

Meanwhile, the plasma frequency of the electron is heightened as the electron density becomes high. If the plasma frequency of the electron exceeds the frequency of the microwave generated by the high frequency power supply 105, i.e., if a cutoff frequency in the plasma generation region 122 becomes higher than the frequency of the microwave, such a phenomenon is observed that an electric field of the microwave is cut off at a surface of the plasma generation region 122. Namely, the microwave is reflected by the plasma generation region 122. This phenomenon is more strongly observed as the electron density becomes higher.

Thus, the plasma density cannot be higher even though the power of the microwave is increased, so that the plasma density becomes saturated in the plasma generation region 122.

Meanwhile, the top plate 104 needs to have a certain thickness to secure a strength of the chamber 101, whose inside is depressurized and to thereby sustain the atmospheric pressure. Generally, uncontrollable standing waves 121 of the microwave are formed in the top plate 104 with such a thickness, as shown in FIG. 7. Due to the formation of such uncontrollable standing waves 121, the uniformity of the plasma density distribution becomes deteriorated in the plasma generation region 122.

As described above, since the plasma density cannot be further increased in the plasma generation region 122 and the uniformity of the plasma density distribution cannot be further improved beyond a certain level, it is difficult to perform an efficient and uniform plasma processing on the substrate 111.

SUMMARY OF THE INVENTION

The present invention has been made for resolving the aforementioned problems, and it is therefore an object of the present invention to provide a plasma processing apparatus capable of increasing a plasma density and improving the uniformity of the plasma density distribution.

A plasma processing apparatus in accordance with the present invention is to perform a process on a substrate by exposing the substrate to a plasma generation region, and includes a chamber, a top plate unit and an antenna unit. The substrate is accommodated in the chamber. The top plate unit serves as a part of a partition wall of the chamber. The antenna unit supplies a high frequency electromagnetic field into the chamber to form the plasma generation region in a region between the top plate unit and the substrate accommodated in the chamber. The top plate unit contains a flat plate portion disposed to face the accommodated substrate and being in contact with the antenna unit and a side wall portion formed to extend from a peripheral region of the flat plate portion towards a side where the substrate is disposed.

According to such a configuration, the side wall portion as well as the flat plate portion are formed in the top plate unit, so that a region (area) of the top plate unit facing the plasma generation region is increased. Further, since the microwave is irradiated into the chamber from the side wall portion, the plasma density at the plasma generation region is enhanced.

It is preferable that the side wall portion has a thickness of $\lambda_g/4$ or greater, wherein $\lambda_g$ is a wavelength of a high frequency electromagnetic field based on a dielectric constant of the top plate unit.

By this, standing waves can be efficiently formed in the side wall portion, and the microwave having a greater power can be supplied towards a part corresponding to a periphery portion of the substrate 11 in the plasma generation region 22. Further, since $\lambda_g/4$ may allow an error of ±20 %, the lowest limit of the thickness of the side wall portion 4b becomes $\lambda_g/4 \times 0.8$. The thickness of the side wall portion 4b needs to be equal to or greater than $\lambda_g/4$, because if a thickness H2 of the side wall portion 4b is smaller than $\lambda_g/4$, the standing waves of the microwave cannot be formed properly in the part of the side wall portion. Further, the clause "the flat plate portion is in contact with the antenna unit" refers to a case where the flat plate portion and the antenna unit maintain a gap therebetween, which is equal to or smaller than 1/10 of the microwave wavelength in atmosphere, and also includes a case where the flat plate portion is close contacted with the antenna unit without having a gap therebetween.

Meanwhile, in case where the thickness of the side wall portion is considerably thick, an interference pattern originating from a variation of a power density of the electromagnetic field is produced by the standing waves formed in the side wall portion, and thus the plasma becomes an unstable state. Accordingly, for suppressing the occurrence of the interference pattern as explained above and for producing a plasma stably, it is preferable that the side wall portion has a thickness smaller than $\lambda_g$.

Further, it is preferable that sides of the flat plate portion and the side wall portion facing the plasma generation region have a smooth and curved surface extending between the flat plate portion and the side wall portion.

By this, a reflection of the microwave is reduced while the microwave propagates through the top plate unit, so that the microwave efficiently propagates.

Still further, a gas injection opening for supplying a gas into the chamber is included, and it is preferable that the gas injection opening is disposed to inject the gas along the side wall portion.

By this, the processing gas supplied along the side wall portion is dissociated efficiently by the plasma generation region to thereby contribute to the plasma processing.

Still further, it is preferable that the chamber contains a conductive portion being in contact with an outer peripheral region of the side wall portion.

By this, a part of the top plate unit not facing the plasma generation region is covered with conductors, and a reflection of the microwave is reduced while the microwave propagates through the top plate unit, so that the microwave efficiently propagates. Further, the clause "the conductive portion is in contact with the outer peripheral region of the side wall portion" refers to a case where the conductive portion and the side wall portion maintain a gap therebetween, which is equal to or smaller than 1/10 of the microwave wavelength in atmosphere, and also includes a case where the side wall portion is close contacted with the conductive portion without having a gap therebetween.

DETAILED DESCRIPTION OF THE PREFERRED EMBODIMENT

Figure 1:
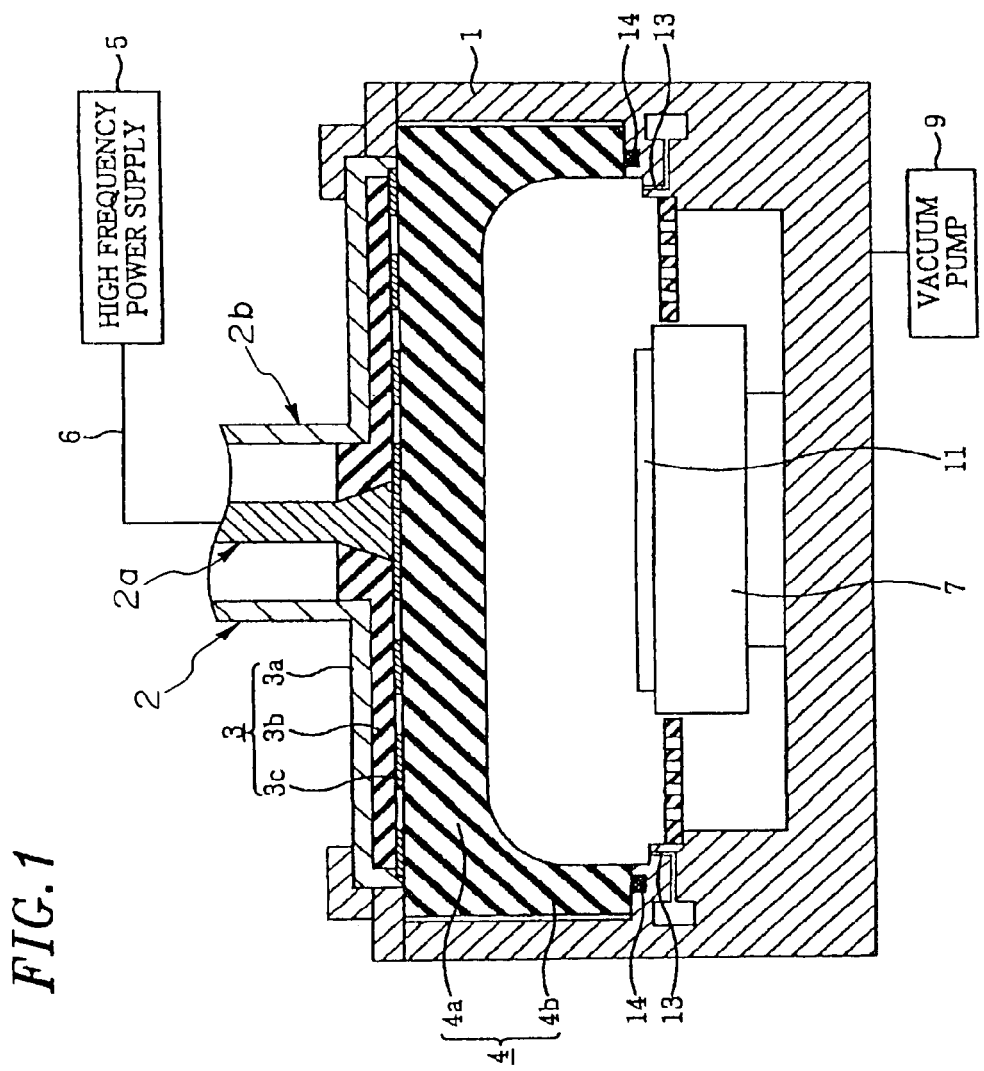
FIG. 1 offers a cross sectional view of a plasma processing apparatus in accordance with a preferred embodiment of the present invention.

A plasma processing apparatus in accordance with the present invention will now be described. As shown in FIG. 1, the plasma processing apparatus includes a chamber 1 accommodating therein a substrate 11 and performing a predetermined processing on the substrate 11; a high frequency power supply 5 for generating a microwave; a waveguide 6; a coaxial waveguide 2 comprising inner conductor 2a and outer conductor 2b; and an antenna unit 3 for irradiating the microwave into the chamber 1.

The antenna unit 3 is comprised of a slot plate 3c, a wave retardation plate 3b, and an antenna cover 3a. The slot plate 3c is made of, e.g., a copper plate having a thickness of about 0.1 mm~several mm. The slot plate 3c is provided with a plurality of slots (openings) for irradiating the microwave towards the inside of the chamber 1. The inner conductor 2a of the coaxial waveguide 2 is connected to the slot plate 3c for supplying microwaves generated by the microwave source 5 to the slot plate 3c.

In the chamber 1, a susceptor 7 for supporting the substrate 11 on which a predetermined plasma processing is carried out is provided. Further, a vacuum pump 9 is connected to the chamber 1 in order to vacuum-exhaust the inside thereof.

A top plate unit 4 serving as a part of a partition wall of the chamber 1 is disposed in an upper part of the chamber 1. The top plate unit 4 is made of a dielectric material, e.g., a quartz. A sealing member 14, e.g., an O-ring is provided between the top plate unit 4 and the partition wall of the chamber 1. The antenna unit 3 is disposed above the top plate unit 4.

Particularly, the top plate unit 4 has a flat plate portion 4a and a side wall portion 4b. The flat plate portion 4a is disposed to face the accommodated substrate 11 and is in contact with the slot plate 3c. The side wall portion 4b is formed to extend from a peripheral region of the flat plate portion 4a towards a side where the substrate 11 is disposed. An outer peripheral surface of the side wall portion 4b is in contact with the chamber 1.

Sides of the flat plate portion 4a and the side wall portion 4b facing the plasma generation region have a smooth and curved surface extending between the flat plate portion 4a and the side wall portion 4b. Hereinafter, the top plate unit 4 having the flat plate portion 4a and the side wall portion 4b is referred to as a bell jar type top plate unit 4, in contrast with a conventional flat plate type top plate unit having only a flat plate portion.

A thickness H1 of the side wall portion 4b is equal to or greater than $\lambda_g/4$, wherein $\lambda_g$ is a wavelength of the microwave based on a dielectric constant of the top plate unit 4. The wavelength $\lambda_g$ of the microwave propagating through the top plate unit 4 is about 60 mm, given that the wavelength of the microwave is 2.45 GHz and the dielectric constant of the top plate unit 4 made of, e.g., a quartz is taken into consideration. Therefore, it is preferable that the thickness H1 of the side wall portion 4b is equal to or greater than about 15 mm which corresponds to ¼ of the wavelength $\lambda_g$ of the microwave.

Here, $\lambda_g/4$ may allow an error of ±20%. As a result, the lowest limit of the thickness H1 of the side wall portion 4b becomes $\lambda_g/4 \times 0.8$ (about 12 mm).

Figure 3:
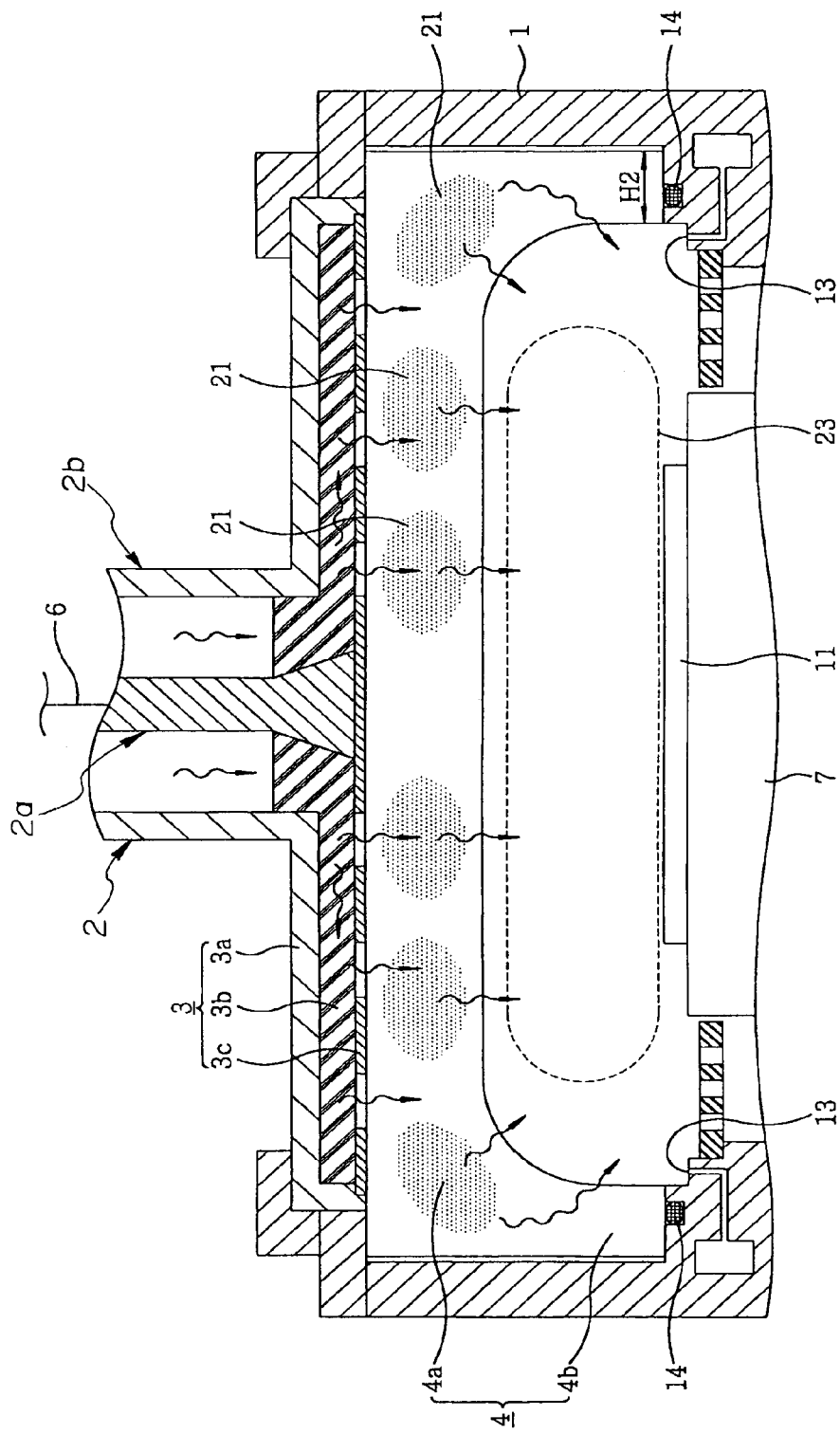
FIG. 3 provides a second view showing propagation of a microwave for explaining an operation of the plasma processing apparatus in the same preferred embodiment.

The thickness H1 of the side wall portion 4b needs to be equal to or greater than $\lambda_g/4$ as mentioned above, because if a thickness H2 of the side wall portion 4b is smaller than $\lambda_g/4$, as shown in FIG. 3, standing waves of the microwave that will be discussed later cannot be formed properly in the part of the side wall portion 4b.

On the other hand, if the thickness H1 of the side wall portion 4b is considerably thick, an interference pattern originating from a variation of a power density of the electromagnetic field is produced by the standing waves formed in the side wall portion 4b. If the plasma density is varied to be greater than an intrinsic plasma density of the plasma processing apparatus, the interference pattern is changed to a difference interference pattern, so that two interference patterns which are different each other appear in the vicinity of the intrinsic plasma density.

The occurrence of two different interference patterns results in the variation of the interference pattern, and further, makes the plasma generation unstable, and hence the number of interference patterns needs to be small. The number of interference patterns largely depends on the thickness H1 of the side wall portion 4b, and increases as the thickness H1 of side wall portion 4b becomes large to thereby rapidly increase roughly every integer multiple of $\lambda_g/2$.

For enhancing the plasma density by the side wall portion 4b, the thickness H1 of the side wall portion 4b is preferably equal to or greater than $\lambda_g/4$ as mentioned above, and, more preferably, around $\lambda_g/2$.

However, it is not necessary that the thickness Hi of the side wall portion 4b is equal to or greater than twice of $\lambda_g/2$, i.e., $\lambda_g$. And, it is preferable that the thickness H1 of the side wall portion 4b is smaller than $\lambda_g$ in order to reduce the number of interference patterns to thereby stably produce the plasma.

Further, the clause "the flat plate portion 4a is in contact with the slot plate 3c" refers to a case where the flat plate portion 4a and the slot plate 3c maintain a gap therebetween, which is equal to or smaller than 1/10 of the microwave wavelength in atmosphere, and also includes a case where the flat plate portion 4a is close contacted with the slot plate 3c without having a gap therebetween.

In the same manner, the clause "the side wall portion 4b is in contact with the chamber 1" refers to a case where the side wall portion 4b and the chamber 1 maintain a gap L therebetween, which is equal to or smaller than 1/10 of the microwave wavelength in atmosphere, and also includes a case where the side wall portion 4b is close contacted with the chamber 1 without having a gap therebetween.

The gap is configured to be equal to or smaller than 1/10 of the microwave wavelength as described above, because distribution of the electromagnetic field inside the top plate unit 4 is changed by the electromagnetic field generated in the gap, if there is a gap greater than 1/10 of the microwave wavelength.

Next, a plasma processing by the above-described plasma apparatus will be discussed. First, the inside of the chamber 1 is exhausted to vacuum by the vacuum pump 9, and a gas, e.g., an argon gas, for producing a plasma under a predetermined pressure range is introduced into the chamber 1.

Meanwhile, the microwave is generated by the high frequency power supply 5. The generated microwave arrives at the antenna unit 3 through the coaxial waveguide 2. The microwave arriving at the antenna unit 3 propagates inside the wave retardation plate 3b towards the periphery thereof, as indicated by arrows. The microwave propagating through the wave retardation plate 3b is irradiated into the chamber 1 through the slot plate 3c, as indicated by the arrows. By the microwave irradiated into the chamber 1, the electromagnetic field is generated in the chamber 1.

The argon gas is ionized by the electromagnetic field generated in the chamber 1, and the plasma generation region 22 is formed between the substrate 11 and the top plate unit 4. If a processing gas is introduced into the plasma generation region 22, it is dissociated, whereby a predetermined plasma processing is performed on the substrate 11.

In the aforementioned plasma processing apparatus, the top plate unit 4 is of a bell jar type and is provided with the side wall portion 4b in addition to the flat plate portion 4a are formed, so that a region (area) of the top plate unit 4 facing the plasma generation region 22 is increased.

In a conventional plasma processing apparatus, there is a limitation on the enhancement of the plasma density in the plasma generation region since the microwave is irradiated only from the flat plate portion. Since, however, the microwave is irradiated from the side wall portion 4b as well as from the flat plate portion 4a towards the inside of the chamber 1 in the present plasma processing apparatus, the microwave irradiated from the side wall portion 4b can contribute to the improvement of the plasma density in the plasma generation region 22.

As a result, the plasma density in the plasma generation region 22 is further improved in the present plasma processing apparatus, and thus, the plasma processing can be performed more efficiently.

Figure 2:
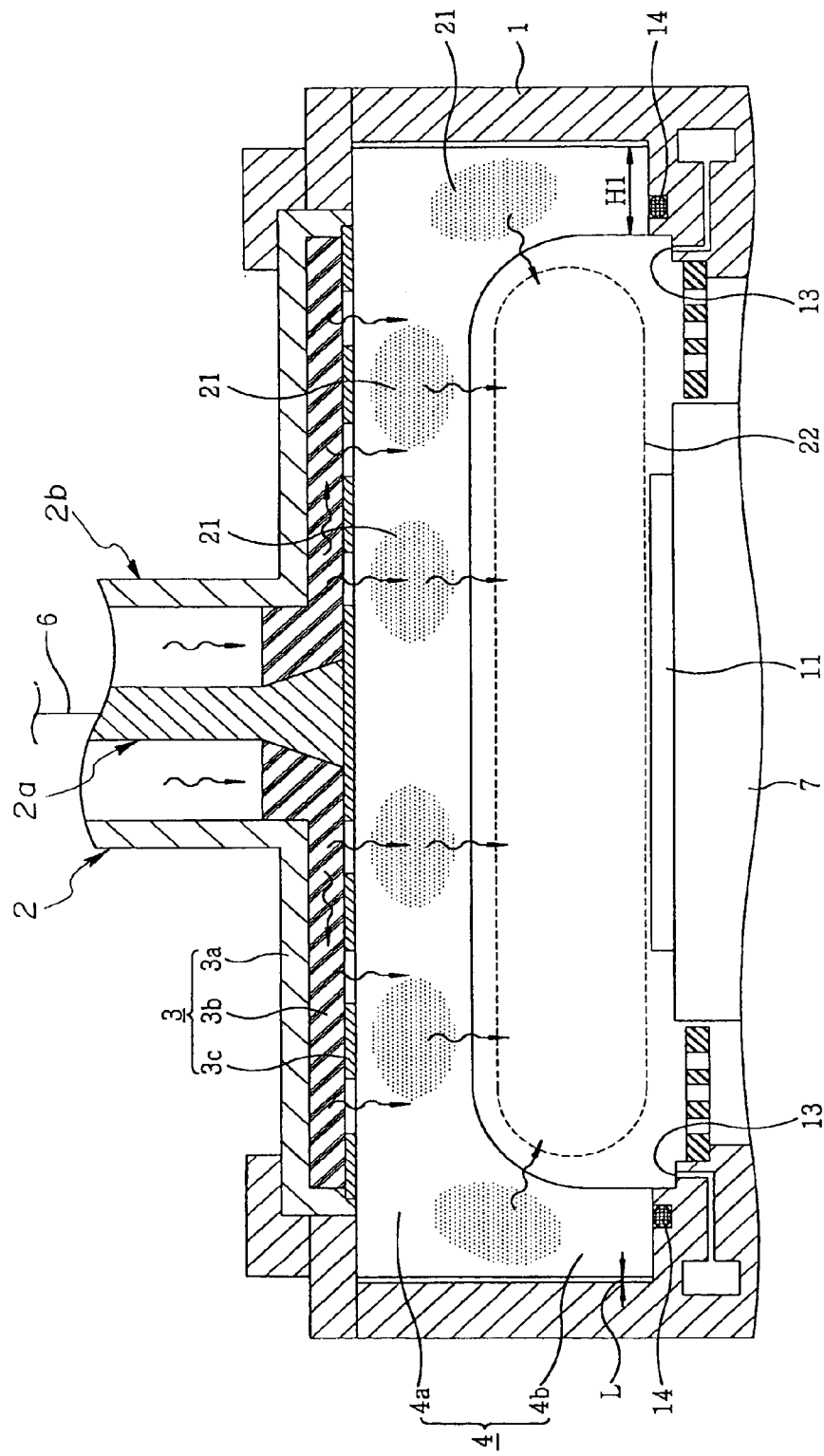
FIG. 2 is a first view showing propagation of a microwave for explaining an operation of the plasma processing apparatus in the same preferred embodiment.

Particularly, in the present plasma processing apparatus, the side wall portion 4b has the thickness H1 equal to or greater than $\lambda_g/4$, wherein $\lambda_g$ is the wavelength of the microwave based on the dielectric constant of the top plate unit 4. Accordingly, the standing waves 21 can be formed in the side wall portion 4b as shown in FIG. 2.

Meanwhile, by setting the thickness H1 of the side wall portion 4b to be smaller than $\lambda_g$, the number of interference patterns produced in the side wall portion 4b is reduced and thus the plasma can be produced stably.

Further, the flat plate portion 4a is in contact with the slot plate 3c, and the outer peripheral surface of the side wall portion 4b is in contact with the chamber 1. Accordingly, a part of the top plate unit 4 not facing the plasma generation region 22 is covered with conductors. Therefore, a reflection of the microwave is reduced while the microwave propagates through the top plate unit, so that the microwave efficiently propagates.

Still further, sides of the flat plate portion 4a and the side wall portion 4b facing the plasma generation region have a smooth and curved surface extending between the flat plate portion 4a and the side wall portion 4b. As a result, reflection of the microwave is suppressed when the microwave propagates from the flat plate portion 4a to the side wall portion 4b, so that the microwave efficiently propagates to the side wall portion 4b.

By doing this, the standing waves 21 are efficiently formed in the side wall portion 4b by the microwave propagated thereto, and the microwave having a greater power can be supplied towards a part corresponding to a periphery portion of the substrate 11 in the plasma generation region 22. As a result, the plasma density in the plasma generation region 22 can be increased and, at the same time, the uniformity of the plasma density is further improved, whereby the plasma processing can be performed more uniformly on the substrate 11.

Meanwhile, in case where the side wall portion 4b has a thickness H2 smaller than $\lambda_g/4$, as shown in FIG. 3, standing waves cannot be formed certainly in the side wall portion 4b. In this case, the microwave having a greater power cannot be supplied towards the part corresponding to the periphery portion of the substrate 11 in the plasma generation region 22, and the plasma density in the plasma generation region 22 cannot be increased sufficiently.

Subsequently, measurement and evaluation of the plasma density (electron density) for the above-described plasma processing apparatus will now be discussed. First, the plasma generation region was formed inside the plasma processing apparatus under a condition of 2 KW of microwave power, 67 Pa of pressure, 1.7 Pa·m³/sec of argon flow rate, and 0.034 Pa·m³/sec of nitrogen flow rate.

The electron density in the plasma generation region was measured using a Langmuir probe. Further, the electron density of the conventional plasma processing apparatus (flat plate type) was measured as a reference in the same manner.

Figure 4:
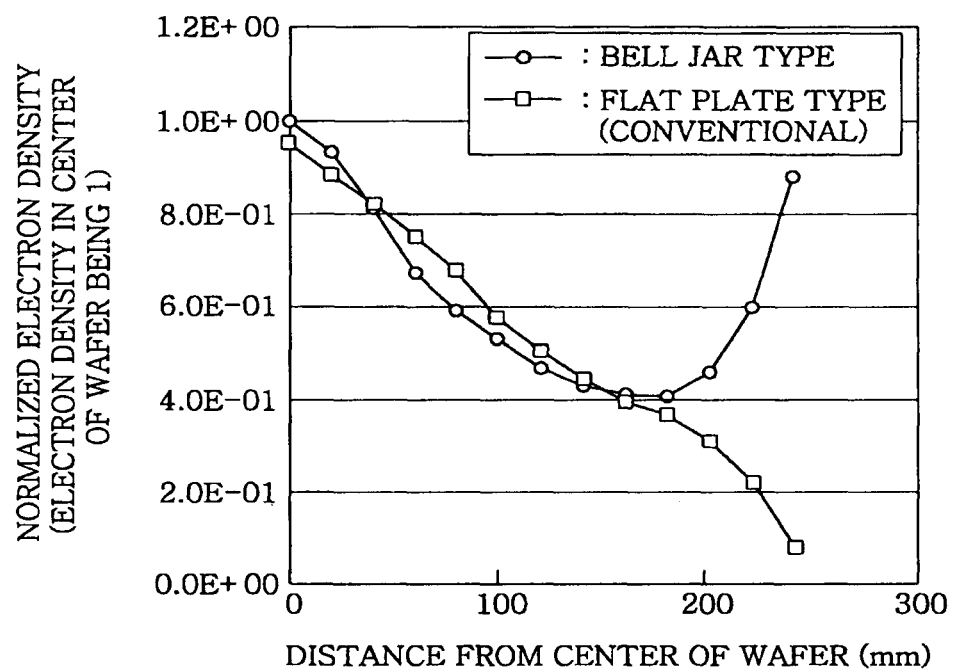
FIG. 4 sets forth a view for showing a measurement result of the electron density in the plasma generation region of the plasma processing apparatus described in FIG. 2 in the same embodiment.

The results are shown in FIG. 4. The horizontal axis, represents a distance from a position corresponding to the center of the substrate towards the outer periphery of the substrate. The vertical axis represents the electron density, specifically, shows values where the electron density at the position corresponding to the center of the substrate is normalized as 1.

As shown in FIG. 4, it can be noted that the electron density in the plasma generation region of the conventional plasma processing apparatus decreases gradually from the center of the substrate towards the outer side.

On the other hand, the present plasma processing apparatus exhibits a trend that the electron density gradually increases from a position spaced apart from the position corresponding to the center of the substrate by about 150 mm. From this, it was verified that the microwave having a greater power is supplied towards the part corresponding to the periphery portion of the substrate in the plasma generation region 22, whereby the electron density can be increased.

Figure 7:
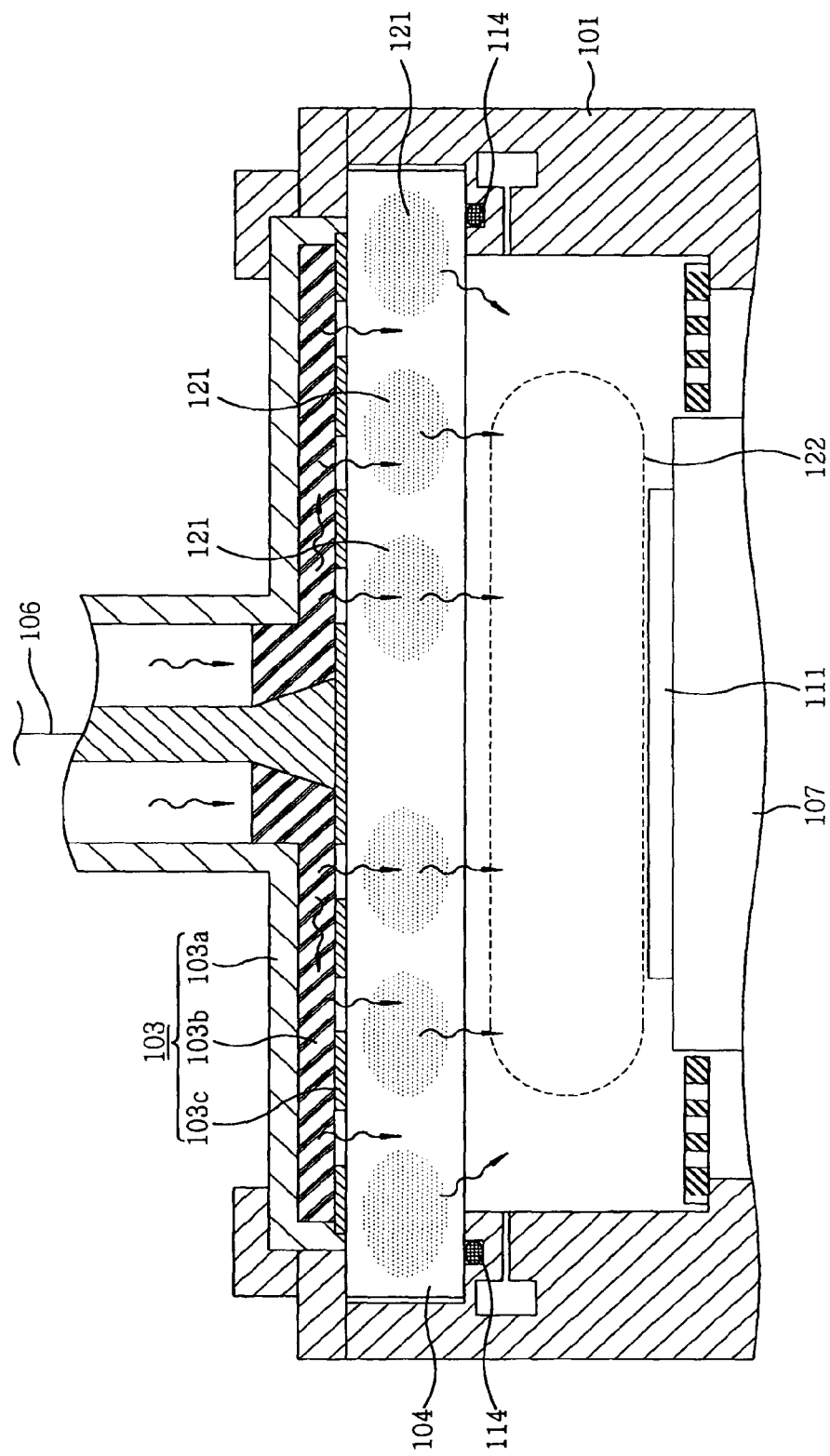
FIG. 7 depicts a view for showing propagation of a microwave for explaining an operation of the plasma processing apparatus described in FIG. 6.

The above can also be constructed in a different manner as follows. First, in the conventional plasma processing apparatus, the microwave is irradiated from the flat plate type top plate 104 into the plasma generation region 122, as shown in FIG. 7. Thus, the boundary condition is configured such that the microwave is supplied only from the outer periphery of the top plate 104 into the part corresponding to the periphery portion of the substrate 111 in the plasma generation region 122, and the plasma generation region 122 disappears at the side portion of the chamber 101.

In contrast, in the present plasma processing apparatus, the microwave is also supplied from the side wall portion 4b (side portion of the chamber 1) towards the part corresponding to the periphery portion of the substrate 11 in the plasma generation region 22, by the standing waves 21 formed in the side wall portion 4b of the bell jar type top plate unit 4. Therefore, the boundary condition is configured such that the plasma generation region 22 is generated at the side wall portion 4b.

As a result, in the present plasma processing apparatus, it is possible to readily increase the electron density (plasma density) of the plasma generation region compared with the conventional plasma processing apparatus and, at the same time, enhance the uniformity of the electron density. Further, it is possible to perform a predetermined plasma processing on the substrate efficiently and uniformly.

The inventors adjusted the size of, e.g., the top plate unit 4 based on the evaluation results and carried out the plasma density measurement again. The measurement results will now be discussed. First, the plasma generation region was formed inside the plasma processing apparatus under the condition of 1.5 KW of microwave power, 67 Pa of pressure, 1.7 Pa·m³/sec of argon flow rate, and 0.068 Pa·m³/sec of nitrogen flow rate.

Figure 5:
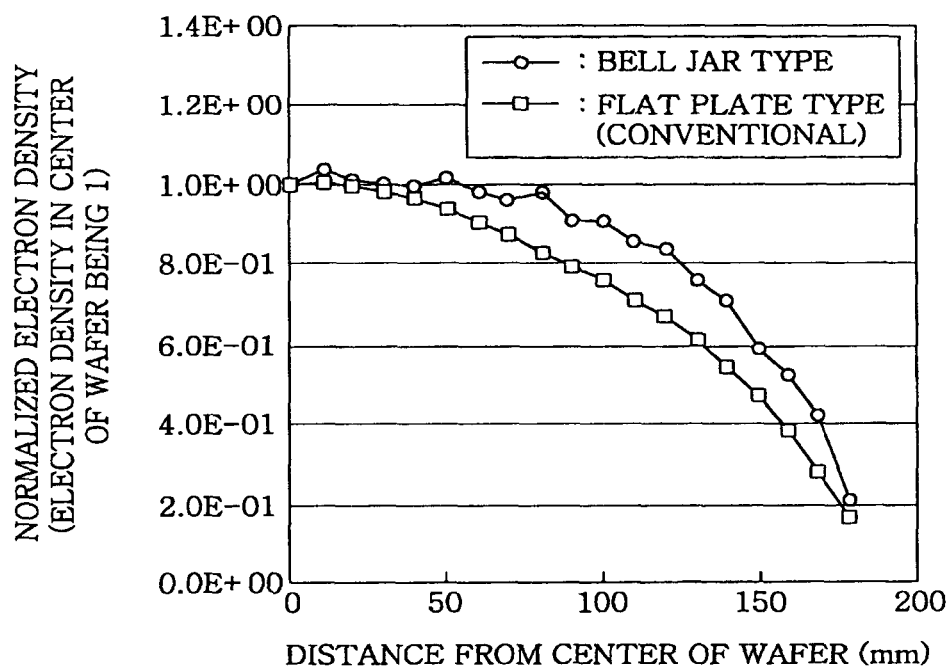
FIG. 5 presents another view for showing a measurement result of the electron density in the plasma generation region of the plasma processing apparatus described in FIG. 2 in the same embodiment.
Figure 6:
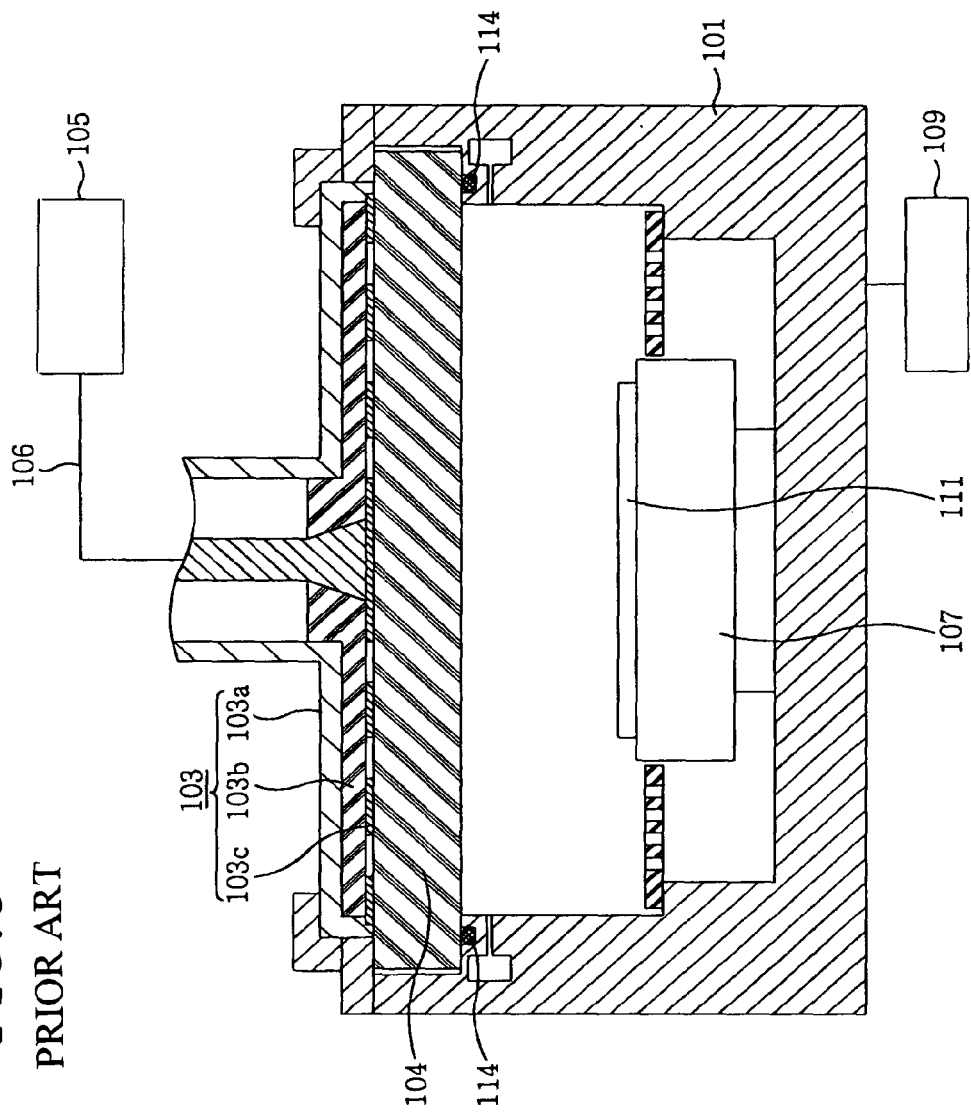
FIG. 6 illustrates a cross sectional view of a conventional plasma processing apparatus.

FIG. 5 describes measurement results of the electron density in the plasma generation region, which was measured by using the Langmuir probe. As shown in FIG. 5, it can be seen that the electron densities in the plasma generation regions of the present and the conventional plasma generation device gradually decrease from the center of the substrate towards the outer side thereof.

However, it was observed that the electron density in the present plasma processing apparatus decreases more slowly from the center of the substrate towards the outer side thereof than that in the conventional plasma processing apparatus.

Thus, it can be seen that the variation of the electron density along the diametric direction of the wafer can be suppressed, and thus the plasma density can be further uniformed, compared with the conventional plasma processing apparatus.

Further, since the boundary condition is configured such that the plasma generation region 22 is generated at the side wall portion 4b of the present plasma processing apparatus (side portion of the chamber 1), it is preferable that gas injection openings 13 for a processing gas and the like are disposed to inject the gas along the side wall portion 4b, as shown in FIG. 2. By doing this, the processing gas supplied along the side wall portion 4b is dissociated efficiently by the plasma generation region to thereby contribute to the plasma processing.

It is to be appreciated that the above-described embodiment is a mere example and thus should not be constructed to be limited thereto. The present invention is defined not by the aforementioned explanations but by claims, and it will be understood that various changes and modifications can be made without departing from the spirit and scope of the invention as defined in the following claims.

In accordance with the plasma processing apparatus of the present invention, the side wall portion as well as the flat plate portion are formed in the top plate unit, so that a region (area) of the top plate unit facing the plasma generation region is increased. Further, since the microwave is irradiated into the chamber from the side wall portion, the plasma density at the plasma generation region is enhanced.

Given that the wavelength of the microwave based on the dielectric constant of the top plate unit is $\lambda_g$. It is preferable that the thickness of the side wall portion is equal to or greater than $\lambda_g/4$. By doing this, it is possible to supply the microwave having a greater power to the part of the plasma generation region corresponding to the outer periphery of the substrate.

Meanwhile, in case where the thickness of the side wall portion is considerably thick, an interference pattern originating from a variation of a power density of the electromagnetic field is produced by the standing waves formed in the side wall portion, and thus the plasma becomes an unstable state. Accordingly, for suppressing the occurrence of the interference pattern as explained above and for producing a plasma stably, it is preferable that the side wall portion has a thickness smaller than $\lambda_g$.

Further, it is preferable that sides of the flat plate portion and the side wall portion facing the plasma generation region have a smooth and curved surface extending between the flat plate portion and the side wall portion. By doing this, reflection of the microwave is reduced while the microwave is provided from the flat plate portion to the side wall portion, so that the microwave efficiently propagates to the side wall portion.

Still further, it is preferable that the gas injection openings for flowing a predetermined gas to the chamber are included and disposed to inject the gas along the side wall portion. By doing this, the processing gas provided along the side wall portion is dissociated efficiently by the plasma generation region to thereby contribute to the plasma processing.

Still further, it is preferable that the chamber contains a conductive portion being in contact with the outer periphery of the side wall portion. By this, in the top plate unit, a part not facing the plasma generation region is covered with the conductors, so that reflection of the microwave is reduced while the microwave is provided by the top plate unit and thus efficiently propagates.

INDUSTRIAL APPLICABILITY

The present invention is effectively used in a structure for improving an uniformity of a plasma density distribution, in plasma processing apparatus performing on a substrate such predetermined plasma processes as etching, ashing and the like, by a plasma generation region formed by introducing a microwave into a chamber.

What is claimed is:

1. A plasma processing apparatus for performing a process on a substrate by exposing the substrate to a plasma, the apparatus comprising:
A microwave source;
A coaxial waveguide comprising an inner conductor and an outer conductor, wherein the inner conductor is connected to a slot antenna for supplying microwaves to the slot antenna;
a chamber for accommodating therein the substrate on a susceptor, the chamber including side walls;
a dielectric top plate member disposed on an upper portion of the chamber; the antenna having a plurality of slots for irradiating a microwave towards an inside of the chamber through the top plate member, the antenna being disposed on the top plate member and being in close contact therewith;
a gas injection opening for supplying a processing gas into the chamber; and a vacuum pump for exhausting the inside of the chamber, wherein the top plate member includes:
a dielectric flat plate portion formed to face the substrate, the dielectric flat plate portion extending substantially horizontally to the chamber side walls; and
a dielectric sidewall portion formed to extend from a peripheral region of the fiat plate portion along the chamber side walls towards the substrate in a plasma generation region, wherein the sidewall portion extends substantially to the periphery of the susceptor,
wherein sides of the fiat plate portion and the sidewall portion have a curved surface facing the plasma generation region and extending between the flat plate portion and the sidewall portion and a thickness of the sidewall portion between the chamber sidewalls and the plasma generation region is constant and is not smaller than $\lambda/4$ but not greater than $\lambda_g$, and a thickness of the flat plate portion between the antenna and the plasma generation region is not smaller than $\lambda/4$ but not greater than $\lambda_g$, $\lambda_g$ being a wavelength of the microwave, and
wherein the microwave propagates from the flat plate portion to the sidewall portion and then is supplied towards a periphery portion of the substrate, thereby enhancing a uniformity of a plasma density in a radial direction of the substrate.

2. The plasma processing apparatus of claim 1, wherein the gas injection opening is disposed to inject the gas along the sidewall portion.

3. The plasma processing apparatus of claim 1, wherein an outer periphery of the sidewall portion is covered with a conductor.

4. The plasma processing apparatus of claim 3, wherein a gap is provided between the sidewall portion and the conductor.

5. The plasma processing apparatus of claim 3, wherein the sidewall portion is in close contact with the conductor without having a gap therebetween.

6. The plasma processing apparatus of claim 1, wherein an inner shape of the top plate member is of a bell jar type.

7. The plasma processing apparatus of claim 1, wherein all microwave irradiated towards the inside of the chamber are introduced through the slots and the top plate.

8. A plasma processing apparatus for performing a process on a substrate by exposing the substrate to a plasma, the apparatus comprising:
A microwave source;
A coaxial waveguide comprising an inner conductor and an outer conductor, wherein the inner conductor is connected to a slot antenna and supplies microwaves to the slot antenna from the microwave source;
a chamber for accommodating therein the substrate on a suceptor, the chamber including side walls;
a dielectric top plate member disposed on an upper portion of the chamber; the antenna having a plurality of slots for irradiating a microwave towards an inside of the chamber through the top plate member, the antenna being disposed on the top plate member and being in close contact therewith;
a gas injection opening for supplying a processing gas into the chamber; and a vacuum pump for exhausting the inside of the chamber, wherein the top plate member includes:
a dielectric flat plate portion formed to face the substrate, the dielectric flat plate portion extending substantially horizontally to the chamber side walls; and
a dielectric sidewall portion formed to extend from a peripheral region of the flat plate portion along the chamber side walls towards the substrate in a plasma generation region wherein the sidewall portion extends substantially to the periphery of the susceptor, and
wherein sides of the flat plate portion and the sidewall portion have a curved surface facing the plasma generation region and extending between the flat plate portion and the sidewall portion and a gap distance between the top plate member and the antenna is equal to or smaller than $\lambda_g/10$, $\lambda_g$ being a wavelength of the microwave, wherein the microwave propagates from the flat plate portion to the sidewall portion and then is supplied towards a periphery portion of the substrate, thereby enhancing a uniformity of a plasma density in a radial direction of the substrate~ wherein a thickness of the sidewall portion between the chamber sidewalls and the plasma generation region is constant and is not smaller than $\lambda_g/4$ but not greater than $\lambda_g$, and a thickness of the flat plate portion between the antenna and the plasma generation region is not smaller than $\lambda_g/4$ but not greater than $\lambda_g$, $\lambda_g$ being a wavelength of the microwave.

9. The plasma processing apparatus of claim 8, wherein the sidewall portion has a thickness not smaller than $\lambda_g/4$ but not greater than $\lambda_g$, $\lambda_g$ being a wavelength of the microwave.

10. The plasma processing apparatus of claim 8, wherein an inner shape of the top plate member is of a bell jar type.

11. The plasma processing apparatus of claim 8, wherein the gas injection opening is disposed to inject the gas along the sidewall portion.

12. The plasma processing apparatus of claim 8, wherein all microwave irradiated towards the inside of the chamber are introduced through the slots and the top plate.

* * * * *